(12) United States Patent
Tang

(10) Patent No.: US 12,176,213 B2
(45) Date of Patent: Dec. 24, 2024

(54) SEMICONDUCTOR STRUCTURE AND MANUFACTURING METHOD USING DIFFERENT ION IMPLANTATION ENERGY

(71) Applicant: CHANGXIN MEMORY TECHNOLOGIES, INC., Hefei (CN)

(72) Inventor: Yi Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 348 days.

(21) Appl. No.: 17/815,623

(22) Filed: Jul. 28, 2022

(65) Prior Publication Data
US 2023/0386845 A1  Nov. 30, 2023

(30) Foreign Application Priority Data
May 24, 2022 (CN) .......................... 202210575586.9

(51) Int. Cl.
| | |
|---|---|
| H01L 21/265 | (2006.01) |
| H01L 21/768 | (2006.01) |
| H01L 21/822 | (2006.01) |
| H10B 12/00 | (2023.01) |

(52) U.S. Cl.
CPC ...... *H01L 21/2652* (2013.01); *H01L 21/7688* (2013.01); *H01L 21/8221* (2013.01); *H10B 12/482* (2023.02); *H10B 12/488* (2023.02)

(58) Field of Classification Search
CPC . H01L 21/2652; H01L 21/482; H01L 21/488; H01L 21/7688; H01L 21/8221
USPC .................................................. 438/514, 519
See application file for complete search history.

(56) References Cited

U.S. PATENT DOCUMENTS

| | | | |
|---|---|---|---|
| 2010/0038719 A1 | 2/2010 | Kim et al. | |
| 2015/0255287 A1* | 9/2015 | Shoji ..................... | H01L 21/266 438/514 |

\* cited by examiner

*Primary Examiner* — Hoai V Pham
(74) *Attorney, Agent, or Firm* — Syncoda LLC; Feng Ma

(57) ABSTRACT

Embodiments of the present disclosure provide a semiconductor structure and a manufacturing method thereof. The method includes: providing a substrate, wherein the substrate includes a word line region, a bit line region, and a capacitive region arranged adjacently; forming a first stacked structure that covers a surface of the substrate, wherein the first stacked structure includes a first sacrificial layer located on the surface of the substrate and a first semiconductor layer located on a surface of the first sacrificial layer; forming a second stacked structure that covers a surface of the first stacked structure, wherein the second stacked structure includes a second sacrificial layer located on the surface of the first stacked structure and a second semiconductor layer located on a surface of the second sacrificial layer; and performing an ion implantation on the first semiconductor layer and the second semiconductor layer.

15 Claims, 7 Drawing Sheets

SEMICONDUCTOR STRUCTURE AND MANUFACTURING METHOD USING DIFFERENT ION IMPLANTATION ENERGY

CROSS-REFERENCE TO RELATED APPLICATIONS

This application claims the priority of Chinese Patent Application No. 202210575586.9, submitted to the Chinese Intellectual Property Office on May 24, 2022, the disclosure of which is incorporated herein in its entirety by reference.

TECHNICAL FIELD

Embodiments of the present disclosure relate to the field of semiconductors, and in particular to a semiconductor structure and a manufacturing method thereof.

BACKGROUND

With the increasing demand for high-performance low-cost semiconductor devices, higher requirement for integration density is imposed on semiconductor devices.

In a 3D dynamic random access memory (DRAM) structure, memory cells are stacked on top of logic cells to achieve a higher yield per unit wafer area. Compared with a common flat DRAM structure, the 3D DRAM structure can effectively reduce unit costs of DRAMs.

However, an ion doping process is a crucial process step that affects a refresh time of a manufactured 3D DRAM device. Due to the stacked structure of the 3D DRAM device, a doping control capability of the ion doping process is reduced, resulting in a problem of non-uniform concentration distribution of doped ions in the semiconductor structure.

SUMMARY

Embodiments of the present disclosure provide a semiconductor structure and a manufacturing method thereof.

An embodiment of the present disclosure provides a method of manufacturing a semiconductor structure, including: providing a substrate, wherein the substrate includes a word line region, a bit line region, and a capacitive region arranged adjacently, wherein the bit line region and the capacitive region are located on two opposite sides of the word line region; forming a first stacked structure that covers a surface of the substrate, wherein the first stacked structure includes a first sacrificial layer located on the surface of the substrate and a first semiconductor layer located on a surface of the first sacrificial layer; forming a second stacked structure that covers a surface of the first stacked structure, wherein the second stacked structure includes a second sacrificial layer located on the surface of the first stacked structure and a second semiconductor layer located on a surface of the second sacrificial layer; and performing an ion implantation on the first semiconductor layer and the second semiconductor layer, wherein an energy at which the ion implantation is performed on the first semiconductor layer is greater than an energy at which the ion implantation is performed on the second semiconductor layer, to maintain a concentration of doped ions in the first semiconductor layer located in the bit line region and the capacitive region within a preset concentration range, and a concentration of doped ions in the second semiconductor layer located in the bit line region and the capacitive region within the preset concentration range.

An embodiment of the present disclosure further provides a semiconductor structure, using the method of manufacturing a semiconductor structure provided in the foregoing embodiment, and including: a substrate including a word line region, a bit line region, and a capacitive region arranged adjacently, wherein the bit line region and the capacitive region are located on two opposite sides of the word line region; a first stacked structure located on a surface of the substrate, wherein the first stacked structure includes a first sacrificial layer located on the surface of the substrate and a first semiconductor layer located on a surface of the first sacrificial layer; and a second stacked structure located on a surface of the first stacked structure, wherein the second stacked structure includes a second sacrificial layer located on the surface of the first stacked structure and a second semiconductor layer located on a surface of the second sacrificial layer, wherein a concentration of doped ions in the first semiconductor layer located in the bit line region and the capacitive region falls within the preset concentration range, and a concentration of doped ions in the second semiconductor layer located in the bit line region and the capacitive region falls within the preset concentration range.

BRIEF DESCRIPTION OF THE DRAWINGS

One or more embodiments are described illustratively by use of corresponding drawings. The illustrative description does not constitute any limitation on the embodiments. Unless otherwise expressly specified, the drawings do not constitute a scale limitation. To describe the technical solutions in the embodiments of the present disclosure or in the prior art more clearly, the following outlines the drawings to be used in the embodiments of the present disclosure. Evidently, the drawings outlined below are merely some embodiments of the present disclosure. Those of ordinary skill in the art may derive other drawings from the outlined drawings without making any creative effort.

DETAILED DESCRIPTION

As can be learned from the background, during doping of stacked devices in a manufacturing process of a semiconductor structure, there is a problem of weak doping control capability, resulting in non-uniform concentration distribution of doped ions in the semiconductor structure.

Analysis found that the following reasons cause the foregoing problem: An internal structure of a semiconductor device becomes complex due to stacked settings of the internal structure of the semiconductor device. For example, when the semiconductor device is provided with a silicon/germanium silicon/silicon structure with three layers stacked in sequence, silicon located in the first layer and silicon located in the third layer are separated by germanium silicon. Consequently, doped ions cannot be uniformly implanted into the silicon in the first layer and the silicon in the third layer during ion implantation due to presence of the germanium silicon, and concentrations of the doped ions in the silicon in the first layer and the silicon in the third layer cannot be uniformly distributed, affecting reliability of the semiconductor device and reducing service performance of the semiconductor device.

An embodiment of the present disclosure provides a semiconductor structure and a manufacturing method thereof, to improve a doping control capability for stacked devices.

The embodiments of the present disclosure are described in detail below with reference to the accompanying drawings. However, those of ordinary skill in the art can understand that many technical details are proposed in the embodiments of the present disclosure to help readers better understand the present disclosure. However, even is without these technical details and various changes and modifications made based on the following embodiments, the technical solutions claimed in the present disclosure may still be realized.

Figure 1:
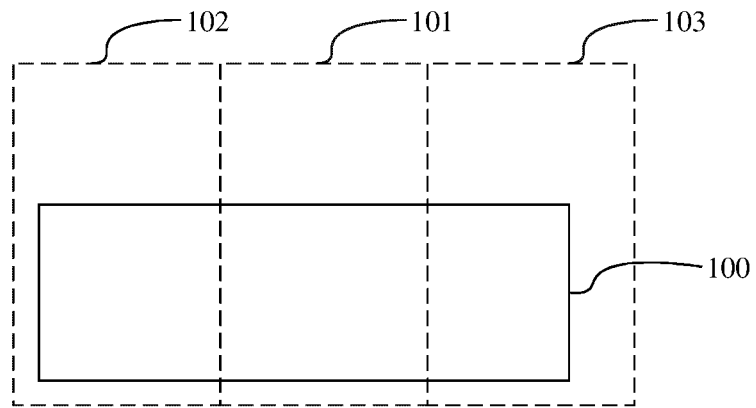
FIG. 1 to FIG. 11 are schematic structural diagrams corresponding to steps of a method of manufacturing a semiconductor structure according to an embodiment of the present disclosure.
Figure 12:
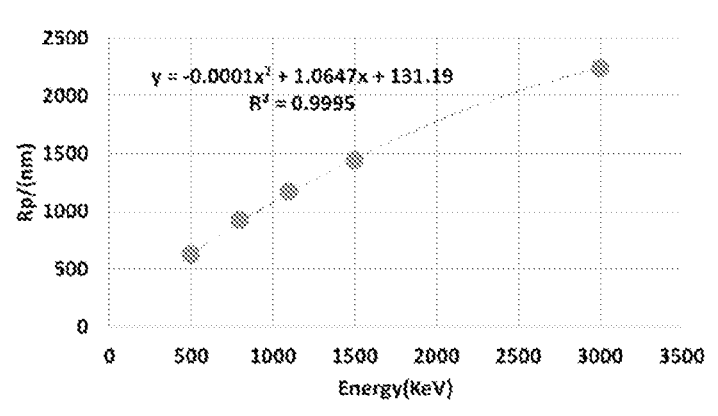
FIG. 12 is a line graph showing a relationship between ion implantation energies and depths according to an embodiment of the present disclosure.
Figure 13:
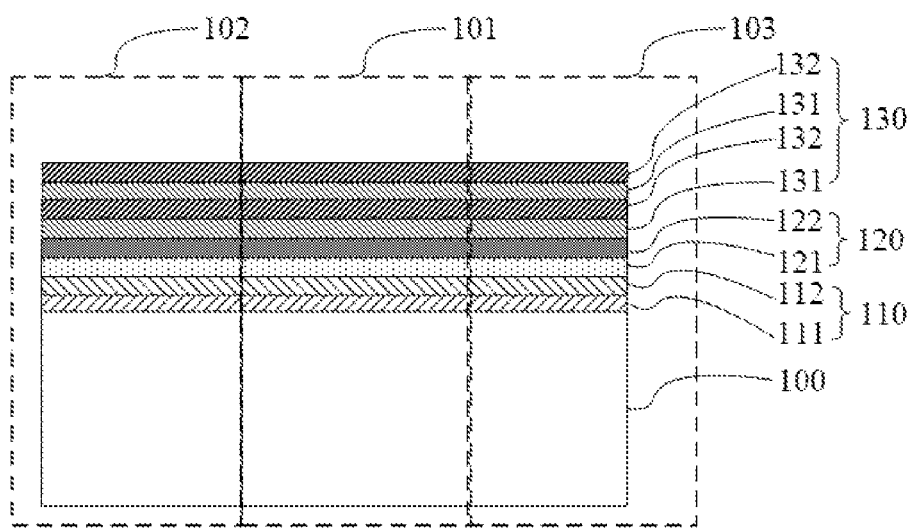
FIG. 13 and FIG. 14 are schematic structural diagrams corresponding to steps of another method of manufacturing a semiconductor structure according to an embodiment of the present disclosure.
Figure 14:
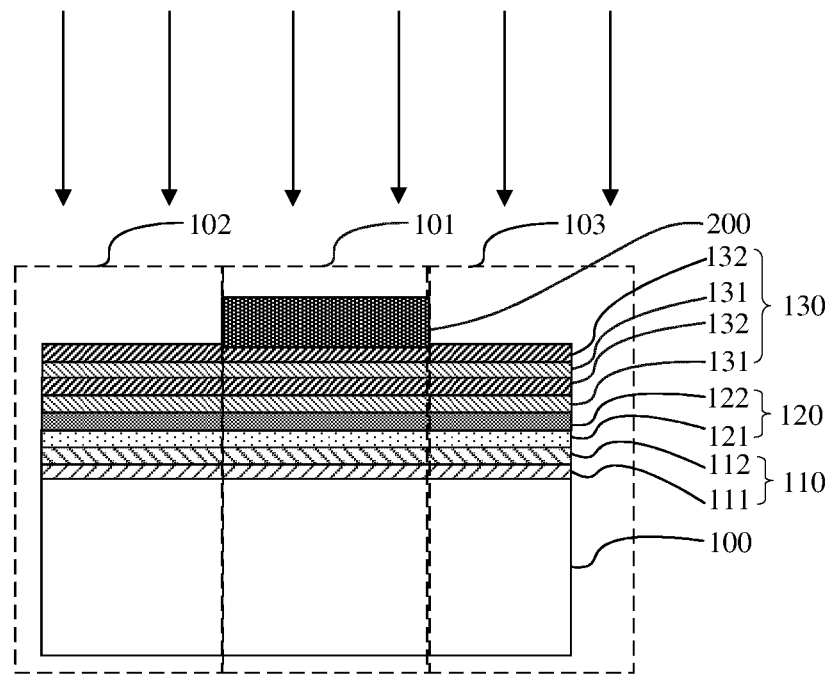

FIG. 1 to FIG. 11 are schematic structural diagrams corresponding to steps of the method of manufacturing a semiconductor structure according to this embodiment. FIG. 12 is a line graph showing a relationship between ion implantation energies and depths according to an embodiment of the present disclosure. FIG. 13 and FIG. 14 are schematic structural diagrams corresponding to steps of another method of manufacturing a semiconductor structure according to an embodiment of the present disclosure. The method of manufacturing a semiconductor structure provided in this embodiment is described in detail below with reference to the accompanying drawings. The details are as follows:

Referring to FIG. 1 to FIG. 11, FIG. 13, and FIG. 14, the method of manufacturing a semiconductor structure includes the following steps:

Referring to FIG. 1, a substrate 100 is provided, where the substrate 100 includes a word line region 101, a bit line region 102, and a capacitive region 103 arranged adjacently, where the bit line region 102 and the capacitive region 103 are located on two opposite sides of the word line region 101.

For the substrate 100, the substrate 100 is a semiconductor material. The semiconductor material includes, but is not limited to, one of a silicon substrate, a germanium substrate, a germanium silicon substrate, or a silicon carbide substrate.

For the word line region 101, the word line region 101 is used to form a gate structure. A voltage signal in the gate structure can control a corresponding transistor to be turned on or off.

In some embodiments, the gate structure may include a gate conductive layer and a gate protection layer. The gate conductive layer is used to transmit a signal. The gate protection layer is used to protect the gate conductive layer, thereby reducing stress on the gate conductive layer when the semiconductor structure is subjected to the stress. In some embodiments, a material of the gate conductive layer may be a metallic material such as tungsten, and a material of the gate protection layer may be an insulating material is such as silicon nitride.

For the bit line region 102, the bit line region 102 is used to form a bit line structure. The bit line structure is used to read data information stored in a capacitor or write data information into a capacitor for storage.

In some embodiments, the bit line structure may be a mono metal, a metal compound, or an alloy. The mono metal may be copper, aluminum, tungsten, gold, silver, or the like. The metal compound may be tantalum nitride or titanium nitride. The alloy may be an alloy material consisting of at least two of copper, aluminum, tungsten, gold, or silver. In addition, the material of the bit line structure may alternatively be at least one of nickel, cobalt, or platinum.

For the capacitive region 103, the capacitive region 103 is used to form a capacitor structure. The capacitor structure is used to store data information.

Figure 2:
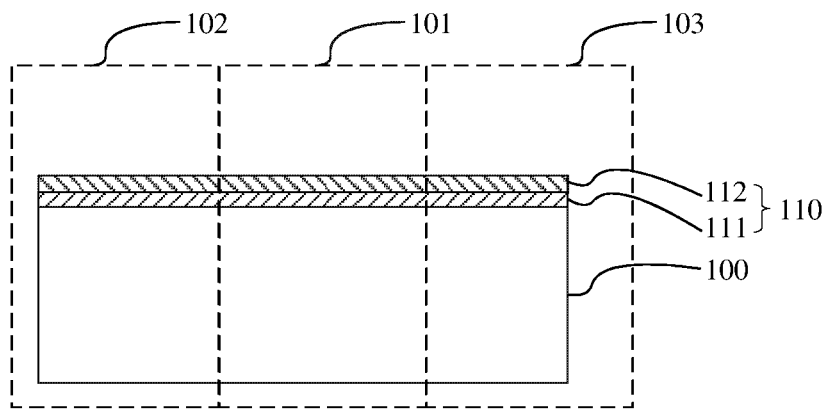

Referring to FIG. 2, a first stacked structure 110 that covers a surface of the substrate 100 is formed, where the first stacked structure 110 includes a first sacrificial layer 111 located on the surface of the substrate 100 and a first semiconductor layer 112 located on a surface of the first sacrificial layer 111.

For the first sacrificial layer 111, the first sacrificial layer 111 may be one of silicon, germanium, silicon-germanium, silicon carbide, and gallium arsenide.

For the first semiconductor layer 112, the first semiconductor layer 112 includes one of monocrystalline silicon, polycrystalline silicon, or amorphous silicon or silicon-germanium. In some embodiments, the material of the first semiconductor layer 112 may be the same as a material of the substrate 100. In some other embodiments, the material of the first semiconductor layer 112 may be different from the material of the substrate 100.

In some embodiments, a process for forming the first sacrificial layer 111 and the first semiconductor layer 112 may be a deposition process. The deposition process may be a chemical vapor deposition process, a physical vapor deposition process, an atomic layer deposition process, or the like. In some other embodiments, the process for forming the first sacrificial layer 111 and the first semiconductor layer 112 may be an epitaxial growth process. The epitaxial growth process may be a molecular beam epitaxy process, an is atmospheric and a reduced pressure epitaxy process, an ultra high vacuum chemical vapor deposition process, or the like.

Figure 3:
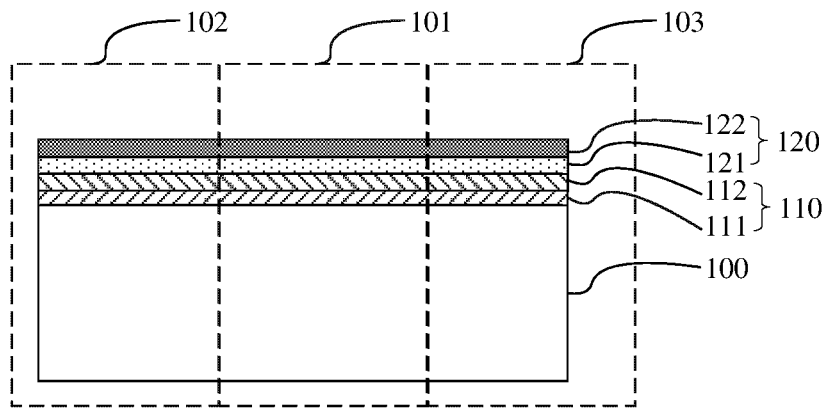

Referring to FIG. 3, form a second stacked structure 120 that covers a surface of the first stacked structure 110, where the second stacked structure 120 includes a second sacrificial layer 121 located on the surface of the first stacked structure 110 and a second semiconductor layer 122 located on a surface of the second sacrificial layer 121.

For the second sacrificial layer 121, the second sacrificial layer 121 includes one of silicon, germanium, silicon-germanium, silicon carbide, and gallium arsenide. In some embodiments, the material of the second sacrificial layer 121 may be the same as the material of the first sacrificial layer 111. In some other embodiments, the material of the second sacrificial layer 121 may be different from the material of the first sacrificial layer 111.

For the second semiconductor layer 122, the second semiconductor layer 122 includes one of monocrystalline silicon, polycrystalline silicon, or amorphous silicon or silicon-germanium. In some embodiments, the material of the second semiconductor layer 122 may be the same as the material of the first semiconductor layer 112. In some other embodiments, the material of the second semiconductor layer 122 may be different from the material of the first semiconductor layer 112.

In some embodiments, a process for forming the second sacrificial layer 121 and the second semiconductor layer 122 may be a deposition process. The deposition process may be a chemical vapor deposition process, a physical vapor deposition process, an atomic layer deposition process, or the like. In some other embodiments, the process for forming the second sacrificial layer 121 and the second semiconductor layer 122 may be an epitaxial growth process. The epitaxial growth process may be a molecular beam epitaxy process, an atmospheric and a reduced pressure epitaxy process, an ultra high vacuum chemical vapor deposition process, or the like.

Perform an ion implantation on the first semiconductor layer 112 and the second semiconductor layer 122, where an energy at which the ion implantation is performed on the first semiconductor layer 112 is greater than an energy at which the ion implantation is performed on the second semiconductor layer 122, to maintain a concentration of is doped ions in the first semiconductor layer 112 located in the bit line region 102 and the capacitive region 103 within a preset concentration range, and a concentration of doped ions in the second semiconductor layer 122 located in the bit line region 102 and the capacitive region 103 within the preset concentration range.

In this embodiment, the preset concentration range may be $1E^{15}$ cm$^{-2}$ to $1E^{18}$ cm$^{-2}$, and specifically, may be $1E^{15}$ cm$^{-2}$, $1E^{17}$ cm$^{-2}$, or $1E^{18}$ cm$^{-2}$. Performing ion implantation based on different doses of doped ions can achieve uniform light doping or heavy doping of a particular region of the semiconductor structure during the ion implantation.

Figure 4:
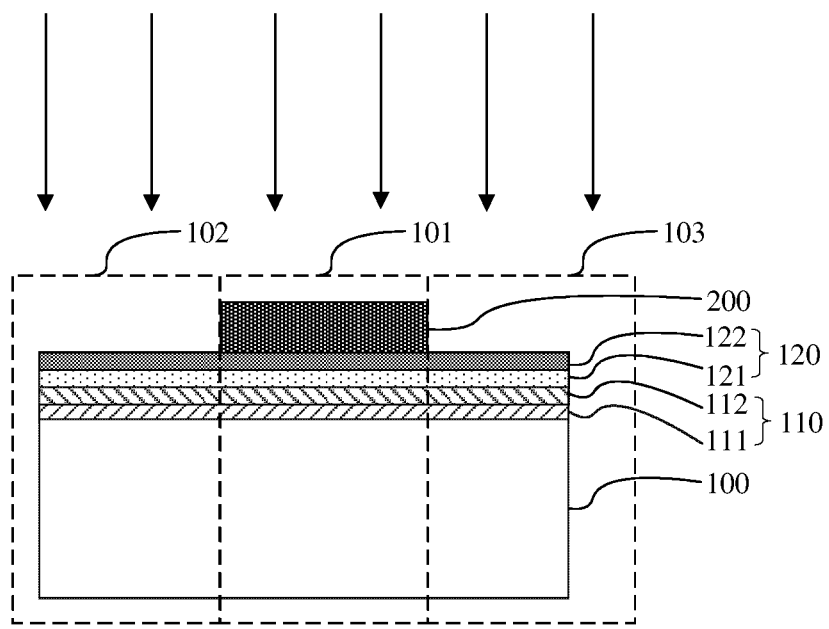

Specifically, referring to FIG. 4, in some embodiments, a method of performing an ion implantation on the first semiconductor layer 112 and the second semiconductor layer 122 includes: forming a mask layer 200, where the mask layer 200 is located on a surface of the second semiconductor layer 122 in the word line region 101; performing ion implantation on the first semiconductor layer 112 at a first energy in a direction perpendicular to the substrate 100; and changing the energy of the ion implantation to a second energy, and performing ion implantation on the second semiconductor layer 122 at the second energy, where a magnitude of the first energy is greater than a magnitude of the second energy. In other words, during the ion implantation, ion implantation is first performed at the first energy to perform ion implantation on the first semiconductor layer 112 close to the substrate 100, such that the concentration of the doped ions in the first semiconductor layer 112 reaches the preset concentration range. Then the energy of the ion implantation is reduced to perform ion implantation at the second energy, to perform ion implantation on the second semiconductor layer 122 located away from the substrate 100, such that the concentration of the doped ions in the second semiconductor layer 122 reaches the preset concentration range. Performing ion implantation on the first semiconductor layer 112 at the larger first energy allows the doped ions to directly reach the first semiconductor layer 112 without staying; and performing ion implantation on the second semiconductor layer 122 at the smaller second energy allows the doped ions to reach only the second semiconductor layer 122, such that the concentration of the doped ions in the second semiconductor layer 122 reaches the preset concentration range while the concentration of the doped ions in the first semiconductor layer 112 is not changed.

Specifically, in some other embodiments, a method of performing ion implantation on the first semiconductor layer 112 and the second semiconductor layer 122 may alternatively be: forming a mask layer 200, where the mask layer 200 is located on a surface of the second semiconductor layer 122 in the word line region 101; performing ion implantation on the first semiconductor layer 112 at a first energy in a direction perpendicular to the substrate 100; and performing ion implantation on the second semiconductor layer 122 at a second energy in the direction perpendicular to the substrate 100, where a magnitude of the first energy is greater than a magnitude of the second energy. In other words, the ion implantation is performed twice. The ion implantation is performed on the first semiconductor layer 112 at the first energy, and then the ion implantation is performed on the second semiconductor layer 122 at the second energy, where the magnitude of the first energy is greater than the magnitude of the second energy. At the first energy, the doped ions directly reach the first semiconductor layer 112 close to the substrate 100. At the second energy, the doped ions can reach only the second semiconductor layer 122 away from the substrate 100. In this way, the ion implantation can be separately performed on the first semiconductor layer 112 and the second semiconductor layer 122. In some embodiments, a type of the doped ions for performing the ion implantation on the first semiconductor layer 112 is the same as a type of the doped ions for performing the ion implantation on the second semiconductor layer 122. In some other embodiments, the type of the doped ions for performing the ion implantation on the first semiconductor layer 112 may be different from the type of the doped ions for performing the ion implantation on the second semiconductor layer 122.

In some embodiments, the mask layer 200 may be polycrystalline silicon, silicon oxide, silicon nitride, or the like. In some embodiments, a process for forming the mask layer 200 may be a deposition process. The deposition process may be a chemical vapor deposition process, a physical vapor deposition process, or an atomic layer deposition process.

Figure 5:
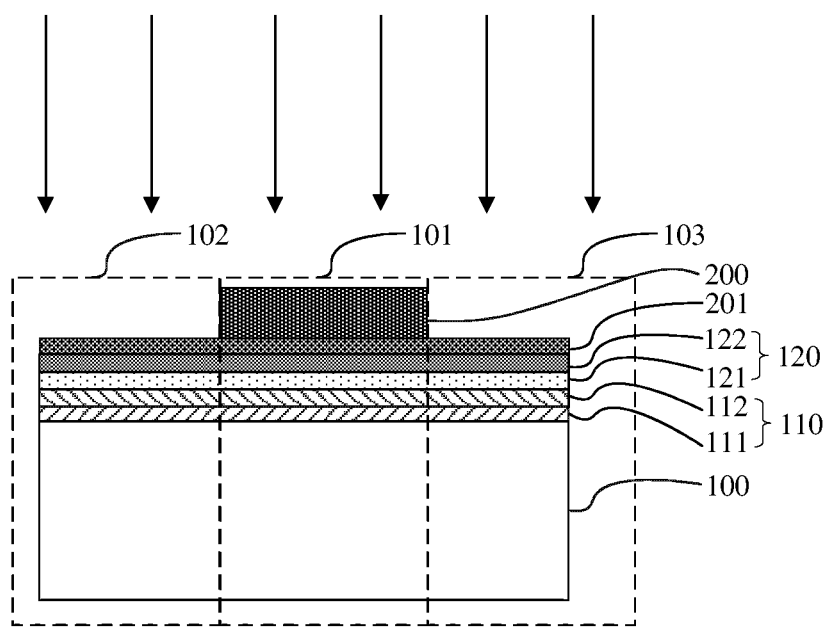

Further, referring to FIG. 5, in some embodiments, after the formation of the second stacked structure 120 and before the formation of the mask layer 200, the manufacturing method further includes: forming a shield layer 201, where the shield layer 201 covers a surface of the second stacked structure 120. The shield layer 201 can protect the surface of the second semiconductor layer 122 against damage or contamination during the ion implantation process, thereby avoiding any impact on performance of the semiconductor structure.

For the shield layer 201, the shield layer 201 may be silicon oxide.

In some embodiments, a process for forming the shield layer 201 may be a deposition process. The deposition process may be a chemical vapor deposition process, a physical vapor deposition process, or an atomic layer deposition process. In some other embodiments, the process for forming the shield layer 201 may be an oxidation process. The oxidation process may be a rapid thermal oxidation process or a low pressure rapid oxidation thermal annealing process.

Figure 6:
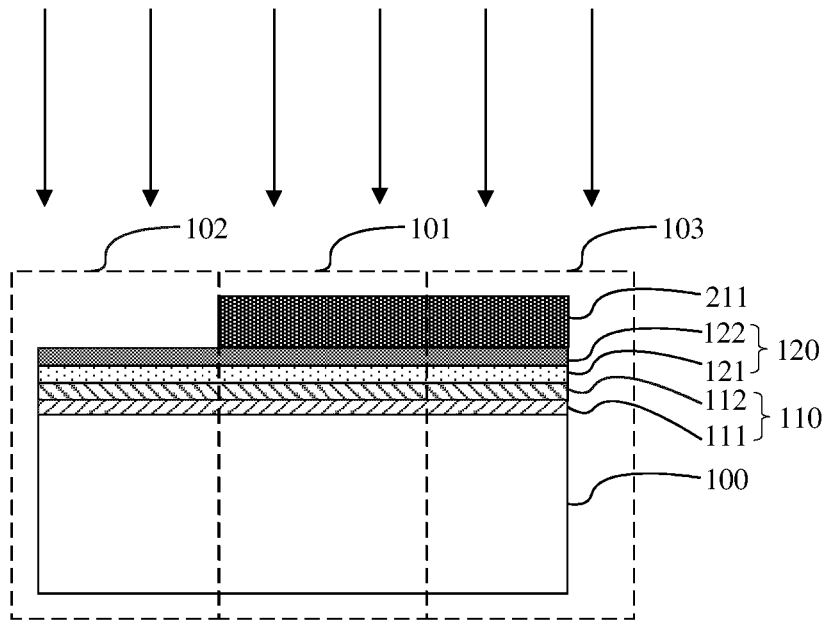
Figure 7:
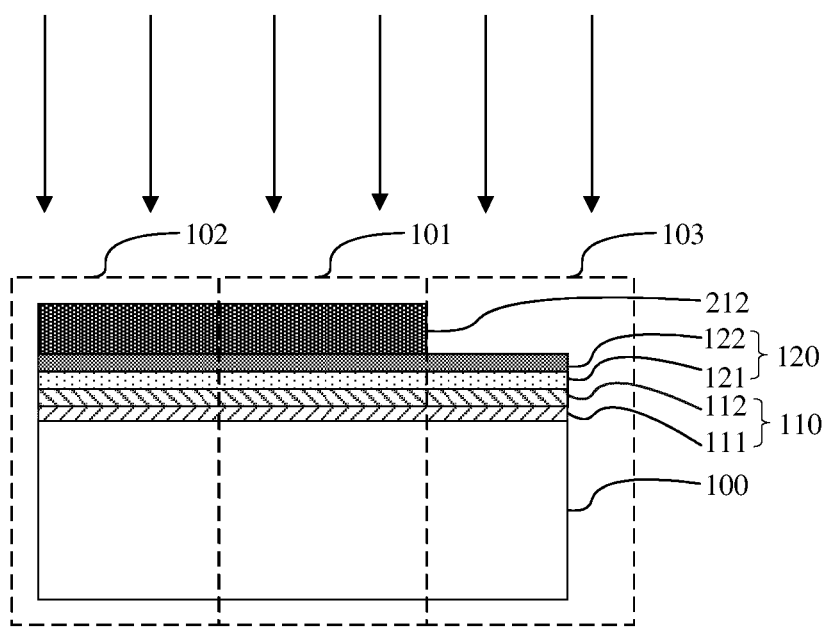

More specifically, the manner of performing ion implantation twice mentioned above includes: referring to FIG. 6, forming a first mask layer 211, where the first mask layer 211 is located on a surface of the second semiconductor layer 122 in the word line region 101 and the capacitive region 103; in a direction perpendicular to the substrate 100, performing first ion implantation on the first semiconductor layer 112 at a first energy, and performing the first ion implantation on the second semiconductor layer 122 at a second energy; referring to FIG. 7, removing the first mask layer 211 and forming a second mask layer 212, where the second mask layer 212 is located on a surface of the second semiconductor layer 122 in the word line region 101 and the bit line region 102; in the direction perpendicular to the substrate 100, performing second ion implantation on the first semiconductor layer 112 at the first energy, and performing the second ion implantation on the second semiconductor layer 122 at the second energy; and removing the first mask layer 211.

In some embodiments, a type of doped ions for performing the first ion implantation is different from a type of doped ions for performing the second ion implantation. In some other embodiments, the type of the doped ions for performing the first ion implantation is the same as the type of the doped ions for performing the second ion implantation.

More specifically, the manner of performing ion implantation twice may alternatively be: referring to FIG. 6, forming a first mask layer 211, where the first mask layer 211 is is located on a surface of the second semiconductor layer 122 in the word line region 101 and the capacitive region 103; in a direction perpendicular to the substrate 100, performing third ion implantation on the first semiconductor layer 112 at the first energy, and performing fourth ion implantation on the second semiconductor layer 122 at the second energy; referring to FIG. 7, removing the first mask layer 211 and forming a second mask layer 212, where the second mask layer 212 is located on a surface of the second semiconductor layer 122 in the word line region 101 and the bit line region 102; in the direction perpendicular to the substrate 100, performing fifth ion implantation on the first semiconductor layer 112 at the first energy, and performing sixth ion implantation on the second semiconductor layer 122 at the second energy; and removing the first mask layer 211.

In some embodiments, a type of doped ions for performing the third ion implantation may be different from a type of doped ions for performing the fourth ion implantation; and a type of doped ions for performing the fifth ion implantation may be different from a type of doped ions for performing sixth ion implantation, such that ion implantation can be performed on semiconductor layers with different layer quantities in a same region by using different types of doped ions.

Figure 8:
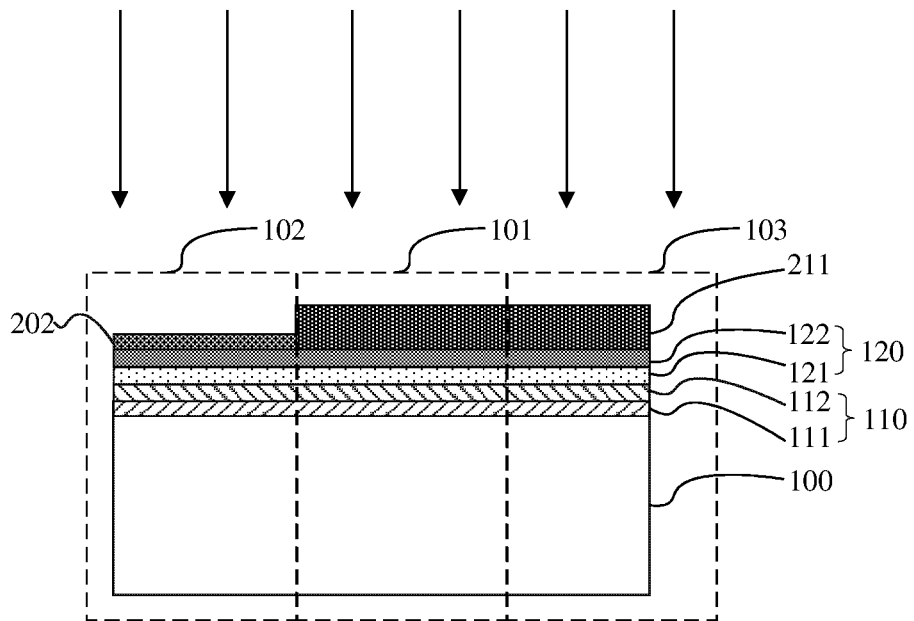
Figure 9:
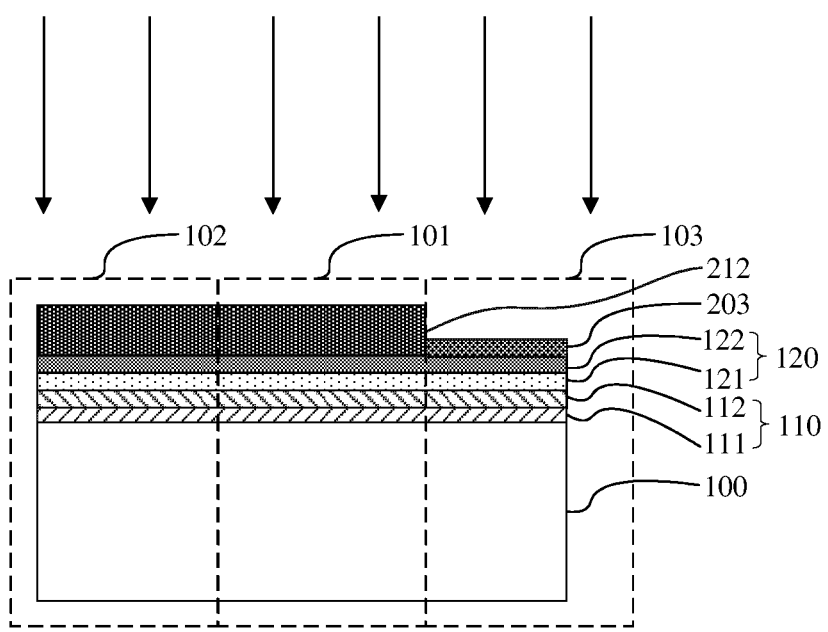
Figure 10:
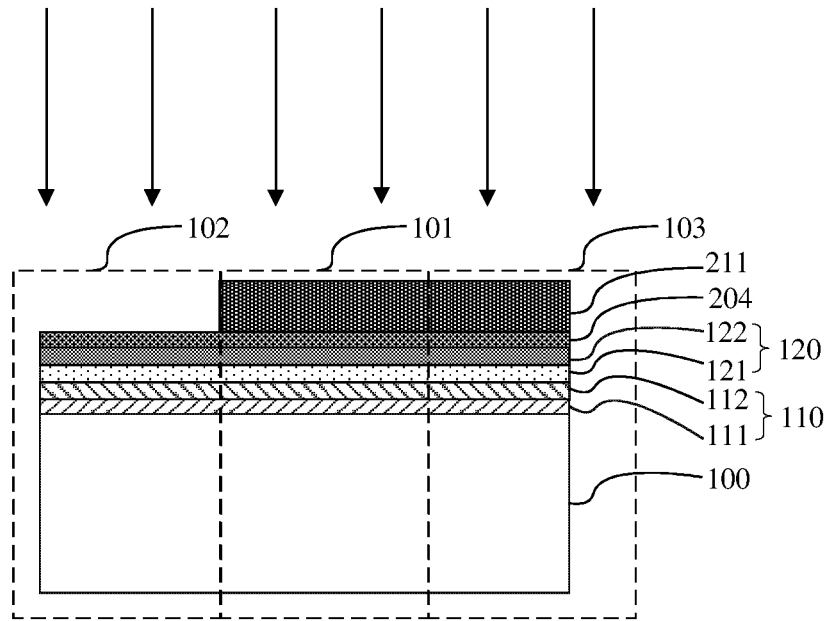
Figure 11:
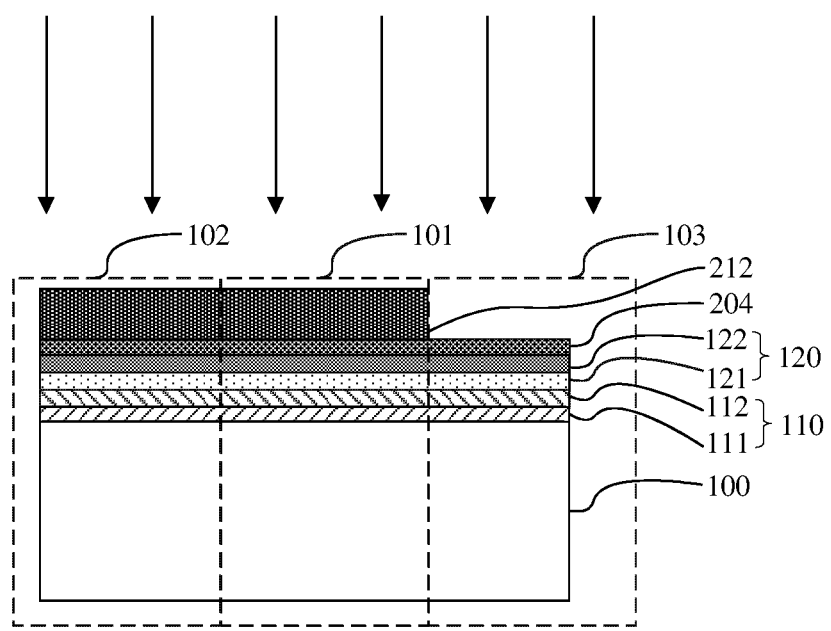

Further, in some embodiments, referring to FIG. 8, after the formation of the second stacked structure 120 and before the formation of the first mask layer 211, the manufacturing method further includes: forming a first shield layer 202, where the first shield layer 202 covers a surface of the second stacked structure 120 in the bit line region 102. Referring to FIG. 9, after the removal of the first mask layer 211 and before the formation of the second mask layer 212, the manufacturing method further includes: removing the first shield layer 202 and forming a second shield layer 203, where the second shield layer 203 covers a surface of the second stacked structure 120 in the capacitive region 103. The first shield layer 202 can protect the surface of the second semiconductor layer 122 in the bit line region 102 against damage or contamination during the ion implantation process, and the second shield layer 203 can protect the surface of the second semiconductor layer 122 in the capacitive region 103 against damage or contamination during the ion implantation process, thereby avoiding any is impact on performance of the semiconductor structure. In some other embodiments, referring to FIG. 10 and FIG. 11, after the formation of the second stacked structure 120 and before the formation of the first mask layer 211, the manufacturing method further includes: forming a third shield layer 204, where the third shield layer 204 covers a surface of the second stacked structure 120. The third shield layer 204 can protect the surface of the second semiconductor layer 122 against any impact of the ion implantation process, and prevent the surface of the second semiconductor layer 122 from being damaged or contaminated, thereby avoiding any impact on performance of the semiconductor structure. In addition, during the removal of the first mask layer 211 or the second mask layer 212, the third shield layer 204 can also be used as a protective layer for the second semiconductor layer 122, thereby preventing the removal process from causing damage or contamination to the surface of the second semiconductor layer 122.

In this embodiment, the removal process may be an etching process. The etching process may be a dry etching process or a wet etching process.

In this embodiment, the doped ions of the ion implantation include N-type ions or P-type ions. The N-type ions may be specifically phosphorus ions, arsenic ions, or antimony ions. The P-type ions may be specifically boron ions, indium ions, and boron fluoride ions.

In this embodiment, referring to FIG. 12, a relationship between a depth y of the ion implantation and an energy x of the ion implantation is $y=-0.0001x^2+1.0647x+131.19$, where a fitting degree $R^2$ is 0.9995, the energy x of the ion implantation is in a unit of KeV, the depth y of the ion implantation is in a unit of nm, and the energy x of the ion implantation ranges from 2 KeV to 3000 KeV, and specifically may be 2 KeV, 1000 KeV, or 3000 KeV.

It can be understood that, based on the structures located in different layers in the stacked structure, the doped ions need to penetrate different depths during the ion implantation process. During actual manufacturing of the semiconductor structure, a depth by which the doped ions need to penetrate may be determined based on a position of a material that needs to be doped, and then a corresponding energy is selected to perform ion implantation, to achieve ion implantation for a material at a particular depth and improve accuracy and uniformity of concentrations of doped ions in the ion implantation, thereby improving a doping control capability of stacked devices.

In some embodiments, an annealing process is further included after the ion implantation process is performed. Because doped ions need to be implanted into the semiconductor structure during the ion implantation process, and high-energy incident doped ions collide with atoms on lattices in the semiconductor structure, causing atoms on some lattices to be displaced, thus resulting in a large quantity of vacancies. As a result, atoms in an ion implantation region are disordered or the region becomes an amorphous region. The annealing process anneals the semiconductor structure at a particular temperature to restore a crystal structure and eliminate defects. In addition, the annealing process also has a function of activating donor and acceptor impurities, that is, causing some doped ions located at gap positions to enter alternative positions through annealing.

In some embodiments, a temperature of the annealing process may be 200° C. to 800° C., and may be specifically 200° C., 400° C., or 800° C.

In some embodiments, referring to FIG. 13, after the formation of the second stacked structure 120, the manufacturing method further includes: forming, on a surface of the second stacked structure 120, a third sacrificial layer 131 and a third semiconductor layer 132 that are alternately stacked, where the third sacrificial layer 131 and the third semiconductor layer 132 form a third stacked layer 130, the number of layers of the third semiconductor layer 132 is greater than or equal to 1, and specifically, there may be two, five, or ten third semiconductor layers 132. It should be noted that, referring to FIG. 13, there are two third semiconductor layers 132 provided in this embodiment of the present disclosure is two layers, but in other embodiment, there may be five or eight third semiconductor layers 132.

Correspondingly, the performing ion implantation on the first semiconductor layer 112 and the second semiconductor layer 122 further includes: performing ion implantation on the third semiconductor layer 132, where an energy at which the ion implantation is performed on the third semiconductor layer 132 is less than the energy at which the ion implantation is performed on the second semiconductor layer 122, to maintain a concentration of doped ions in the third semiconductor layer 132 located in the bit line region 102 and the capacitive region 103 within the preset concentration range.

Specifically, referring to FIG. 14, the performing ion implantation on the first semiconductor layer 112, the second semiconductor layer 122, and the third semiconductor layer 132 includes: forming a mask layer 200, where the mask layer 200 covers a surface of the third stacked layer 130 in the word line region 101; and performing ion implantation on the first semiconductor layer 112 at a first energy in a direction perpendicular to the substrate 100; changing the energy of the ion implantation to a second energy, and performing ion implantation on the second semiconductor layer 122 at the second energy; changing the energy of the ion implantation to a third energy, and performing ion implantation on the third semiconductor layer 132 in the third stacked layer 130 close to the substrate 100 at the third energy; and continuing changing the energy of the ion implantation to a fourth energy, and performing ion implantation on the third semiconductor layer 132 in the third stacked layer 130 away from the substrate 100 at the fourth energy, where a magnitude of the first energy is greater than a magnitude of the second energy, the magnitude of the second energy is greater than a magnitude of the third energy, and the magnitude of the third energy is greater than a magnitude of the fourth energy. It can be understood that, the first semiconductor layer 112, the second semiconductor layer 122, and the third semiconductor layer 132 are each located in a different layer, and thus the doped ions need to penetrate different depths during the ion implantation process. Based on the different positions of the first semiconductor layer 112, the second semiconductor layer 122, and the third semiconductor layer 132, different energies need to be selected for the ion implantation to achieve the objective that the concentration of the doped ions in each of the first semiconductor layer 112, the second semiconductor layer, and the third semiconductor layer 132 falls within the preset concentration range.

In some embodiments, the ion implantation may be performed a corresponding quantity of times based on a total layer quantity of the first semiconductor layer 112, the second semiconductor layer 122, and the third semiconductor layer 132. For example, when there are two third semiconductor layers 132, the total layer quantity of the first semiconductor layer 112, the second semiconductor layer 122, and the third semiconductor layers 132 is 4, and the corresponding quantity of times for performing the ion implantation is four times.

Specifically, a method of performing ion implantation on the first semiconductor layer 112, the second semiconductor layer 122, and the third semiconductor layer 132 includes: forming a mask layer 200, where the mask layer 200 covers a surface of the third stacked layer 130 in the word line region 101; and performing ion implantation on the first semiconductor layer 112 at a first energy in a direction perpendicular to the substrate 100; performing ion implantation on the second semiconductor layer 122 at a second energy in the direction perpendicular to the substrate 100; performing ion implantation on the third semiconductor layer 132 in the third stacked layer 130 close to the substrate 100 at a third energy in the direction perpendicular to the substrate 100; and performing ion implantation on the third semiconductor layer 132 in the third stacked layer 130 away from the substrate 100 at a fourth energy in the direction perpendicular to the substrate 100, where a magnitude of the first energy is greater than a magnitude of the second energy, the magnitude of the second energy is greater than a magnitude of the third energy, and the magnitude of the third energy is greater than a magnitude of the fourth energy.

It can be understood that the ion implantation is performed four times, such that the ion implantation can be performed on the first semiconductor layer 112, the second semiconductor layer 122, and the third semiconductor layer 132 located in different layers. When the first semiconductor layer 112, the second semiconductor layer 122, and the third semiconductor layer 132 are relatively thin, the change in each ion implantation energy during the ion implantation process is relatively small. Therefore, the depth by which the doped ions penetrate change within a time period of ion implantation energy changes, causing the concentrations of the doped ions in different semiconductor layers to have errors and then exceed the preset concentration range. Performing the ion implantation four times separately can prevent inaccuracy of the concentrations of the doped ions caused by the energy change process during the ion implantation, thereby improving a doping control capability for stacked devices.

In some embodiments, a type of doped ions for performing the ion implantation on is the first semiconductor layer 112 may be the same as a type of doped ions for performing the ion implantation on the third semiconductor layer 132; and a type of doped ions for performing the ion implantation on the second semiconductor layer 122 may be the same as the type of doped ions for performing the ion implantation on the third semiconductor layer 132. In some other embodiments, the type of the doped ions for performing the ion implantation on the first semiconductor layer 112 may be different from the type of the doped ions for performing the ion implantation on the third semiconductor layer 132; and the type of the doped ions for performing the ion implantation on the second semiconductor layer 122 may be different from the type of the doped ions for performing the ion implantation on the third semiconductor layer 132.

In some embodiments, the first semiconductor layer 112, the second semiconductor layer 122, and the third semiconductor layer 132 are made of a same material. The first semiconductor layer 112, the second semiconductor layer 122, and the third semiconductor layer 132 may be made of monocrystalline silicon, polycrystalline silicon, or amorphous silicon or silicon-germanium.

In some embodiments, the first sacrificial layer 111, the second sacrificial layer 121, and the third sacrificial layer 131 may be the same. The first sacrificial layer 111, the second sacrificial layer 121, and the third sacrificial layer 131 may be made of one of silicon, germanium, silicon-germanium, silicon carbide, and gallium arsenide.

According to the method of manufacturing a semiconductor structure provided in this embodiment of the present disclosure, a stacked structure is formed, and ion implantation is performed on a first semiconductor layer 112 and a second semiconductor layer 122 in the stacked structure at different energies, where an energy at which the ion implantation is performed on the first semiconductor layer 112 is greater than an energy at which the ion implantation is performed on the second semiconductor layer 122, to maintain a concentration of doped ions in the first semiconductor layer 112 located in a bit line region 102 and a capacitive region 103 within a preset concentration range, and a concentration of doped ions in the second semiconductor layer 122 located in the bit line region 102 and the capacitive region 103 within the preset concentration range, thereby improving a doping control capability of stacked devices.

Anther embodiment of the present disclosure provides a semiconductor structure, using the method of manufacturing a semiconductor structure described above, to improve performance of the formed semiconductor structure. It should be noted that, for parts that are made of a same material as or corresponding to those in the foregoing embodiment, reference may be made to the corresponding description in the foregoing embodiment, and details are not be repeated below.

Figure 15:
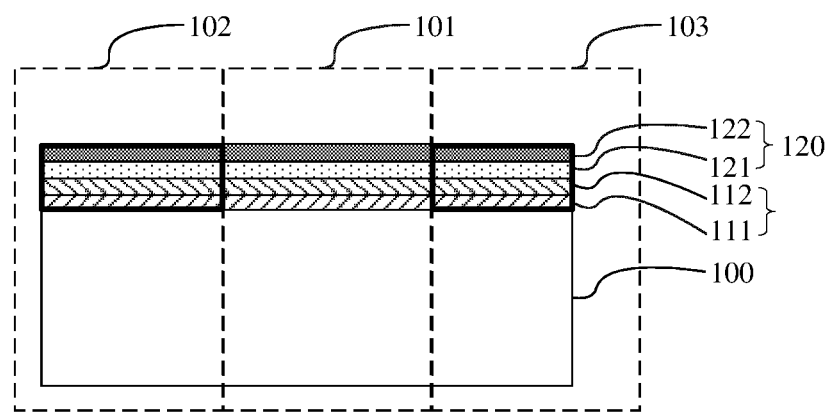
FIG. 15 is a schematic diagram of a semiconductor structure according to an embodiment of the present disclosure.

FIG. 15 is a schematic diagram of a semiconductor structure provided in this embodiment. The semiconductor structure provided in this embodiment is described in detail below with reference to the accompanying drawings. Details are as follows:

Referring to FIG. 15, the semiconductor structure includes: a substrate 100 including a word line region 101, a bit line region 102, and a capacitive region 103 arranged adjacently, where the bit line region 102 and the capacitive region 103 are located on two opposite sides of the word line region 101; a first stacked structure 110 located on a surface of the substrate 100, where the first stacked structure 110 includes a first sacrificial layer 111 located on the surface of the substrate 100 and a first semiconductor layer 112 located on a surface of the first sacrificial layer 111; and a second stacked structure 120 located on a surface of the first stacked structure 110, where the second stacked structure 120 includes a second sacrificial layer 121 located on the surface of the first stacked structure 110 and a second semiconductor layer 122 located on a surface of the second sacrificial layer 121, where a concentration of doped ions in the first semiconductor layer 112 located in the bit line region 102 and the capacitive region 103 falls within a preset concentration range, a concentration of doped ions in the second semiconductor layer 122 located in the bit line region 102 and the capacitive region 103 falls within the preset concentration range.

For the preset concentration range, in this embodiment, the preset concentration range may be $1E^{15}$ cm$^{-2}$ to $1E^{18}$ cm$^{-2}$, and specifically, may be $1E^{15}$ cm$^{-2}$, $1E^{17}$ cm$^{-2}$, or $E^{18}$ cm$^{-2}$.

For the substrate 100, the substrate 100 is a semiconductor material. The semiconductor material includes, but is not limited to, one of a silicon substrate, a germanium substrate, a germanium silicon substrate, or a silicon carbide substrate.

For the first sacrificial layer 111, a material of the first sacrificial layer 111 may be one of silicon, germanium, silicon-germanium, silicon carbide, and gallium arsenide.

For the first semiconductor layer 112, a material of the first semiconductor layer 112 includes one of monocrystalline silicon, polycrystalline silicon, or amorphous silicon or silicon-germanium.

For the second sacrificial layer 121, a material of the second sacrificial layer 121 includes one of silicon, germanium, silicon-germanium, silicon carbide, and gallium arsenide.

For the second semiconductor layer 122, a material of the second semiconductor layer 122 includes one of monocrystalline silicon, polycrystalline silicon, or amorphous silicon or silicon-germanium.

In some embodiments, referring to FIG. 13, a third sacrificial layer 131 and a third semiconductor layer 132 that are alternately stacked are further located on a surface of the second stacked structure 120, the number of layers of the third semiconductor layer 132 is greater than or equal to 1, and specifically, there may be two, five, or eight third semiconductor layers 132, and a concentration of doped ions in the third semiconductor layer 132 located in each of the bit line region 102 and the capacitive region 103 falls within the preset concentration range. It should be noted that, in this embodiment of the present disclosure, there are two third semiconductor layers 132, and in other embodiments, there may be four or eight third semiconductor layers 132.

For the third sacrificial layer 131, a material of the third sacrificial layer 131 may be one of silicon, germanium, silicon-germanium, silicon carbide, and gallium arsenide. In some embodiments, the material of the third sacrificial layer 131 may be the same as the material of the first sacrificial layer 111 and/or the material of the second sacrificial layer 121. In some other embodiments, the material of the third sacrificial layer 131 may be different from the material of the first sacrificial layer 111 and/or the material of the second sacrificial layer 121.

For the third semiconductor layer 132, a material of the third semiconductor layer 132 may be monocrystalline silicon, polycrystalline silicon, or amorphous silicon or silicon-germanium. In some embodiments, the material of the third semiconductor layer 132 may is be the same as the material of the first semiconductor layer 112 and/or the material of the second semiconductor layer 122. In some other embodiments, the material of the third semiconductor layer 132 may be different from the material of the first semiconductor layer 112 and/or the material of the second semiconductor layer 122.

In some embodiments, the semiconductor structure may further include a shield layer, where the shield layer covers a surface of the second stacked structure 120. The shield layer can protect the surface of the second stacked structure 120 against damage or contamination during the ion implantation process, thereby avoiding any impact on performance of the semiconductor structure. In some embodiments, a material of the shield layer includes silicon oxide.

Based on the method of manufacturing a semiconductor structure described above, the semiconductor structure provided in this embodiment of the present disclosure has a stacked structure, and the structure in which the concentration of the doped ions in the first semiconductor layer 112 located in the bit line region 102 and the capacitive region 103 falls within the preset concentration range and the concentration of the doped ions in the second semiconductor layer 122 located in the bit line region 102 and the capacitive region 103 falls within the preset concentration range improves a doping control capability for stacked devices.

Those of ordinary skill in the art can understand that the foregoing implementations are specific embodiments for implementing the present disclosure. During actual application, various changes may be made to the foregoing embodiments in terms of form and details without departing from the spirit and scope of the present disclosure.

The invention claimed is:

1. A method of manufacturing a semiconductor structure, comprising:

providing a substrate, wherein the substrate comprises a word line region, a bit line region, and a capacitive region arranged adjacently, wherein the bit line region and the capacitive region are located on two opposite sides of the word line region;

forming a first stacked structure that covers a surface of the substrate, wherein the first stacked structure comprises a first sacrificial layer located on the surface of the substrate and a first semiconductor layer located on a surface of the first sacrificial layer;

forming a second stacked structure that covers a surface of the first stacked structure, wherein the second stacked structure comprises a second sacrificial layer located on the surface of the first stacked structure and a second semiconductor layer located on a surface of the second sacrificial layer; and performing an ion implantation on the first semiconductor layer and the second semiconductor layer, wherein an energy at which the ion implantation is performed on the first semiconductor layer is greater than an energy at which the ion implantation is performed on the second semiconductor layer, to maintain a concentration of doped ions in the first semiconductor layer located in the bit line region and the capacitive region within a preset concentration range, and a concentration of doped ions in the second semiconductor layer located in the bit line region and the capacitive region within the preset concentration range.

2. The method of manufacturing the semiconductor structure according to claim 1, wherein the performing an ion implantation on the first semiconductor layer and the second semiconductor layer comprises:

forming a mask layer, wherein the mask layer is located on a surface of the second semiconductor layer in the word line region;

performing the ion implantation on the first semiconductor layer at a first energy in a direction perpendicular to the substrate; and changing the energy of the ion implantation to a second energy, and performing the ion implantation on the second semiconductor layer at the second energy, wherein a magnitude of the first energy is greater than a magnitude of the second energy.

3. The method of manufacturing the semiconductor structure according to claim 2, wherein after the formation of the second stacked structure and before the formation of the mask layer, the method of manufacturing further comprises:

forming a shield layer, wherein the shield layer covers a surface of the second stacked structure.

4. The method of manufacturing the semiconductor structure according to claim 1, wherein the performing an ion implantation on the first semiconductor layer and the second semiconductor layer comprises:

forming a mask layer, wherein the mask layer is located on a surface of the second semiconductor layer in the word line region;

performing the ion implantation on the first semiconductor layer at a first energy in a direction perpendicular to the substrate; and performing the ion implantation on the second semiconductor layer at a second energy in the direction perpendicular to the substrate, wherein a magnitude of the first energy is greater than a magnitude of the second energy.

5. The method of manufacturing the semiconductor structure according to claim 1, wherein the performing an ion implantation on the first semiconductor layer and the second semiconductor layer comprises:

forming a first mask layer, wherein the first mask layer is located on a surface of the second semiconductor layer in the word line region and the capacitive region;

in a direction perpendicular to the substrate, performing a first ion implantation on the first semiconductor layer at a first energy, and performing the first ion implantation on the second semiconductor layer at a second energy;

removing the first mask layer and forming a second mask layer, wherein the second mask layer is located on a surface of the second semiconductor layer in the word line region and the bit line region; and in the direction perpendicular to the substrate, performing a second ion implantation on the first semiconductor layer at the first energy, performing the second ion implantation on the second semiconductor layer at the second energy, and removing the second mask layer, wherein types of doped ions for performing the first ion implantation and performing the second ion implantation are different.

6. The method of manufacturing the semiconductor structure according to claim 1, wherein a relationship between a depth y of the ion implantation and an energy x of the ion implantation is $y=-0.0001x^2+1.0647x+131.19$, wherein the energy x of the ion implantation is in a unit of KeV, the depth y of the ion implantation is in a unit of nm, and the energy x of the ion implantation ranges from 2 KeV to 3000 KeV.

7. The method of manufacturing the semiconductor structure according to claim 1, wherein the preset concentration range is $1E^{15}$ cm$^{-2}$ to $1E^{18}$ cm$^{-2}$.

8. The method of manufacturing the semiconductor structure according to claim 1, wherein after the formation of the second stacked structure, the method of manufacturing further comprises:

forming, on a surface of the second stacked structure, a third sacrificial layer and a third semiconductor layer that are alternately stacked, wherein the number of layers of the third semiconductor layer is greater than or equal to 1; and the performing an ion implantation on the first semiconductor layer and the second semiconductor layer further comprises: performing the ion implantation on the third semiconductor layer, wherein an energy at which the ion implantation is performed on the third semiconductor layer is less than the energy at which the ion implantation is performed on the second semiconductor layer, to maintain a concentration of doped ions in the third semiconductor layer located in the bit line region and the capacitive region within the preset concentration range.

9. The method of manufacturing the semiconductor structure according to claim 8, wherein the first semiconductor layer, the second semiconductor layer, and the third semiconductor layer are made of a same material.

10. The method of manufacturing the semiconductor structure according to claim 8, wherein the ion implantation is performed a corresponding quantity of times based on a total layer quantity of the first semiconductor layer, the second semiconductor layer, and the third semiconductor layer.

11. The method of manufacturing the semiconductor structure according to claim 1, wherein the doped ions of the ion implantation comprise one of phosphorus ions, arsenic ions, antimony ions, boron ions, indium ions, and boron fluoride ions.

12. A semiconductor structure, using the method of manufacturing the semiconductor structure according to claim 1, and comprising:
- a substrate comprising a word line region, a bit line region, and a capacitive region arranged adjacently, wherein the bit line region and the capacitive region are located on two opposite sides of the word line region;
- a first stacked structure located on a surface of the substrate, wherein the first stacked structure comprises a first sacrificial layer located on the surface of the substrate and a first semiconductor layer located on a surface of the first sacrificial layer; and
- a second stacked structure located on a surface of the first stacked structure, wherein the second stacked structure comprises a second sacrificial layer located on the surface of the first stacked structure and a second semiconductor layer located on a surface of the second sacrificial layer, wherein
- a concentration of doped ions in the first semiconductor layer located in the bit line region and the capacitive region falls within a preset concentration range, and a concentration of doped ions in the second semiconductor layer located in the bit line region and the capacitive region falls within the preset concentration range.

13. The semiconductor structure according to claim 12, further comprising a shield layer, wherein the shield layer covers a surface of the second stacked structure.

14. The semiconductor structure according to claim 12, wherein a third sacrificial layer and a third semiconductor layer that are alternately stacked are further located on a surface of the second stacked structure, the number of layers of the third semiconductor layer is greater than or equal to 1, and a concentration of doped ions in the third semiconductor layer located in the bit line region and the capacitive region falls within the preset concentration range.

15. The semiconductor structure according to claim 12, wherein the preset concentration range is $1E^{15}$ cm$^{-2}$ to $1E^{18}$ cm$^{-2}$.

* * * * *